(12) United States Patent
Nakazato

(10) Patent No.: US 6,607,380 B1
(45) Date of Patent: Aug. 19, 2003

(54) SUBSTRATE CONVEYING SYSTEM AND DEVICE MANUFACTURING METHOD USING THE SAME

(75) Inventor: Hiroshi Nakazato, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/977,702

(22) Filed: Oct. 16, 2001

Related U.S. Application Data

(63) Continuation of application No. 09/570,061, filed on May 12, 2000, now Pat. No. 6,309,212.

(30) Foreign Application Priority Data

May 14, 1999 (JP) ............................................. 11-134129

(51) Int. Cl.⁷ .............................................. B65G 49/07
(52) U.S. Cl. .................... 432/243; 414/935; 414/940; 414/941; 118/620; 118/720; 118/725
(58) Field of Search ................... 432/239, 241, 432/243; 414/935, 936, 939, 940, 941; 118/620, 642, 720, 725

(56) References Cited

U.S. PATENT DOCUMENTS

| | | | |
|---|---|---|---|
| 4,539,695 A | * | 9/1985 | La Fiandra .............. 250/491.1 |
| 4,591,044 A | | 5/1986 | Ogami et al. ............. 198/346.3 |
| 4,853,880 A | | 8/1989 | Akamatsu et al. .......... 364/559 |
| 4,870,923 A | | 10/1989 | Sugimoto .................... 118/715 |
| 4,887,904 A | | 12/1989 | Nakazato et al. ............ 356/375 |
| 4,984,953 A | | 1/1991 | Nakazato et al. ........... 414/331 |
| 4,985,722 A | * | 1/1991 | Ushijima et al. .............. 134/66 |
| 5,937,223 A | * | 8/1999 | Akimoto et al. ............ 396/604 |
| 6,087,632 A | | 7/2000 | Mizosaki et al. ........... 219/390 |
| 6,104,002 A | | 8/2000 | Hirose et al. ................ 219/390 |
| 6,129,546 A | | 10/2000 | Sada .......................... 432/253 |
| 6,299,363 B1 | * | 10/2001 | Ueda .......................... 396/611 |
| 6,402,508 B2 | * | 6/2002 | Harada et al. ............... 118/719 |
| 6,454,472 B1 | * | 9/2002 | Kim et al. ................... 134/902 |

* cited by examiner

Primary Examiner—Gregory Wilson
(74) Attorney, Agent, or Firm—Fitzpatrick, Cella, Harper & Scinto

(57) ABSTRACT

A semiconductor exposure apparatus includes an exposure stage for holding a substrate when a predetermined exposure process is performed to the substrate, a transfer station for receiving a substrate from a resist coating unit, the transfer station having a temperature adjusting device for adjusting a temperature of the substrate, and a conveying device for conveying a substrate from the transfer station to the exposure stage.

11 Claims, 5 Drawing Sheets

SUBSTRATE CONVEYING SYSTEM AND DEVICE MANUFACTURING METHOD USING THE SAME

This application is a continuation of application Ser. No. 09/570,061, filed on May, 12, 2000 now U.S. Pat. No. 6,309,212, and allowed on Jun. 15, 2001.

FIELD OF THE INVENTION AND RELATED ART

This invention relates to a substrate conveying system and a substrate conveying method with a substrate temperature adjusting function, being usable in a semiconductor device manufacturing system, for example, for conveying a substrate such as a wafer onto an exposure stage, for example. In another aspect, the invention concerns a semiconductor manufacturing apparatus or a device manufacturing method using such a substrate conveying system.

In a semiconductor manufacturing system, different semiconductor manufacturing apparatuses are used to perform plural processes to a wafer to thereby produce semiconductor devices. In these semiconductor manufacturing apparatuses, temperatures suitable to the processes are different and, therefore, it is necessary to control the wafer temperature in each semiconductor manufacturing apparatus.

Particularly, in a semiconductor exposure apparatus, if the wafer temperature differs from the inside temperature of the semiconductor exposure apparatus, thermal distortion will be produced in the wafer. On that occasion, even if a projection optical system having a good resolving power is used, a desired linewidth exposure is not attainable. The registration precision cannot, therefore, be high. Thus, the wafer temperature control is necessary.

Conventionally, temperature adjusting means for wafer conveyance comprises an intermediate transfer table inside a conveyance system unit, which table is equipped with a temperature adjusting mechanism. As a substrate is loaded on the intermediate transfer table by the conveying system, the wafer temperature adjustment is carried out. Then, the temperature-controlled wafer is conveyed However, in such temperature adjusting means wherein an intermediated transfer table (temperature adjusting unit) having a substrate temperature adjusting mechanism is used so that a wafer is once conveyed to the temperature adjusting unit and then the substrate temperature is adjusted, it takes an additional time to transfer a substrate to the temperature adjusting unit. The overall processing speed in the semiconductor manufacturing apparatus is thus lowered, by an amount corresponding to the time required for the substrate temperature adjustment by the temperature adjusting unit. Further, the addition of substrate transfer operations causes adhesion of contaminants. Moreover, the provisions of such a substrate temperature adjusting unit results in bulkiness of the conveying system itself.

Further, since, in such a temperature adjusting unit, the heat exchange is carried out by contact to substantially the whole bottom surface (lower face) of the wafer, the transfer operation of the wafer to a hand mechanism of the conveying system needs to push the wafer upwardly through three pins. This pushing operation further lowers the overall processing speed of the semiconductor manufacturing apparatus. Also, there is an inconvenience of production of dust particles.

SUMMARY OF THE INVENTION

It is accordingly an object of the present invention to provide a substrate conveying system and/or a substrate conveying method by which a temperature of a substrate can be adjusted without a decrease in an overall processing speed of a semiconductor manufacturing apparatus and without enlargement of the contamination production frequency.

In accordance with an aspect of the present invention, there is provided a substrate conveying system, comprising: a transfer station whereat a substrate can be transferred between said substrate conveying system and a particular system different from said substrate conveying system, said transfer station having a substrate temperature adjusting plate for adjusting a temperature of the substrate; and substrate conveying means for conveying between said transfer station and a desired position.

The substrate temperature adjusting plate may have at least three protrusions formed on its surface, for supporting the substrate.

Heat exchange may be carried out through a clearance defined between the substrate and said substrate temperature adjusting plate.

The clearance defined between the substrate and said substrate temperature adjusting plate may be not greater than 0.2 mm.

The substrate temperature adjusting plate may have a notch defined so that said plate does not interfere with a substrate holding portion of said substrate conveying means when the substrate is to be transferred.

In accordance with another aspect of the present invention, there is provided a substrate conveying method, comprising the steps of: conveying a substrate from a particular system to a transfer station whereat a substrate can be transferred from or to the particular system; adjusting a temperature of the substrate at the transfer station; and conveying the substrate from the transfer station to a desired position.

In accordance with a further aspect of the present invention, there is provided a semiconductor manufacturing apparatus including a substrate conveying system as recited above.

In accordance with a yet further aspect of the present invention, there is provided a device manufacturing method including a process for manufacturing a semiconductor device by use of a semiconductor manufacturing apparatus as recited above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
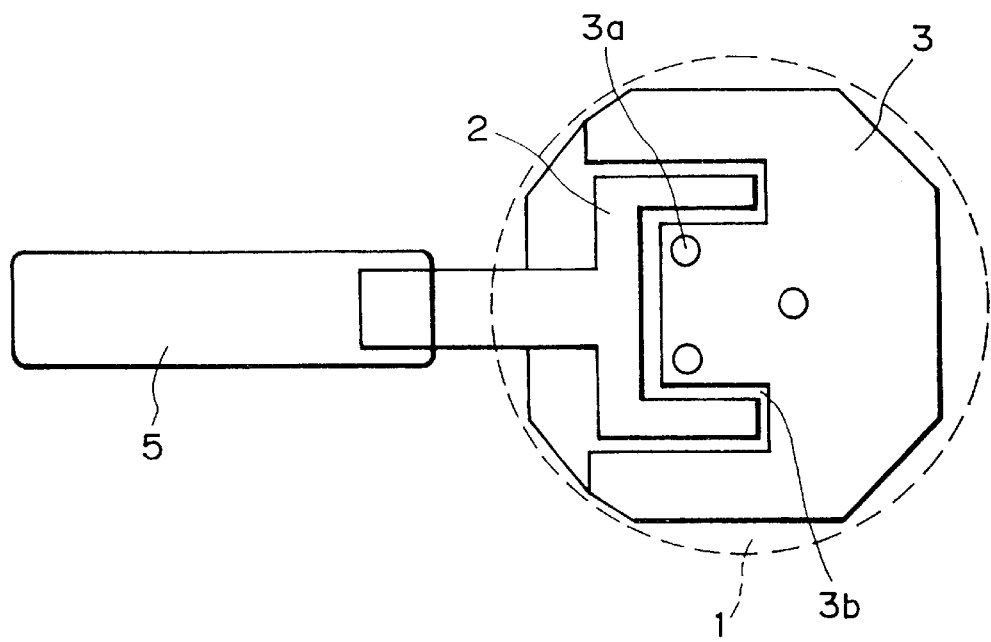
FIG. 1 is a plan view of a substrate conveying system according to an embodiment of the present invention.

FIG. 1 is a plan view of a substrate conveying system according to an embodiment of the present invention. As shown in FIG. 1, the substrate conveying system of this embodiment comprises a conveying mechanism which includes fingers 2 (wafer holding portion) for holding a wafer 1 thereon, and a hand arm 5 being movable upwardly and downwardly and horizontally. There is a temperature adjusting plate 3 which has a notched portion 3b formed with a shape corresponding to the fingers 2, so as to receive the finger 2 therein. The outside shape of the plate 3 approximately corresponds to the size of the wafer 1.

Figure 2:
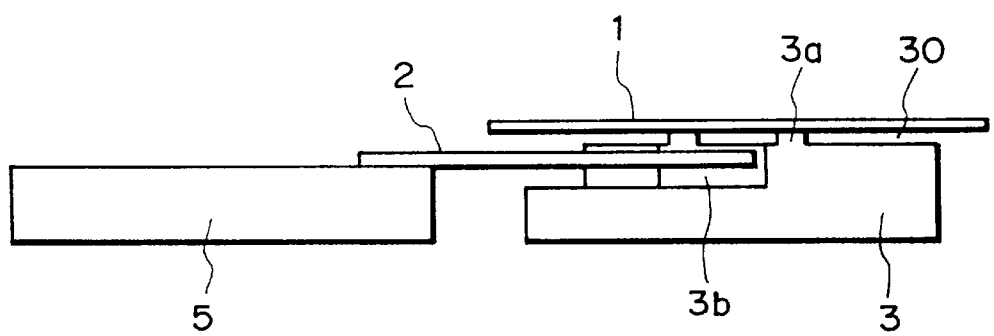
FIG. 2 is a side view of a substrate conveying system according to an embodiment of the present invention.

FIG. 2 is a side view of a substrate receiving station of the substrate conveying system of this embodiment. The temperature adjusting plate 3 has small protrusions 3a which contact the wafer 1. Between the temperature adjusting plate 3 and the wafer 1 with respect to the vertical direction, there is a very small space, that is, a small clearance 30, which is defined by the small protrusions 3a.

Figure 3:
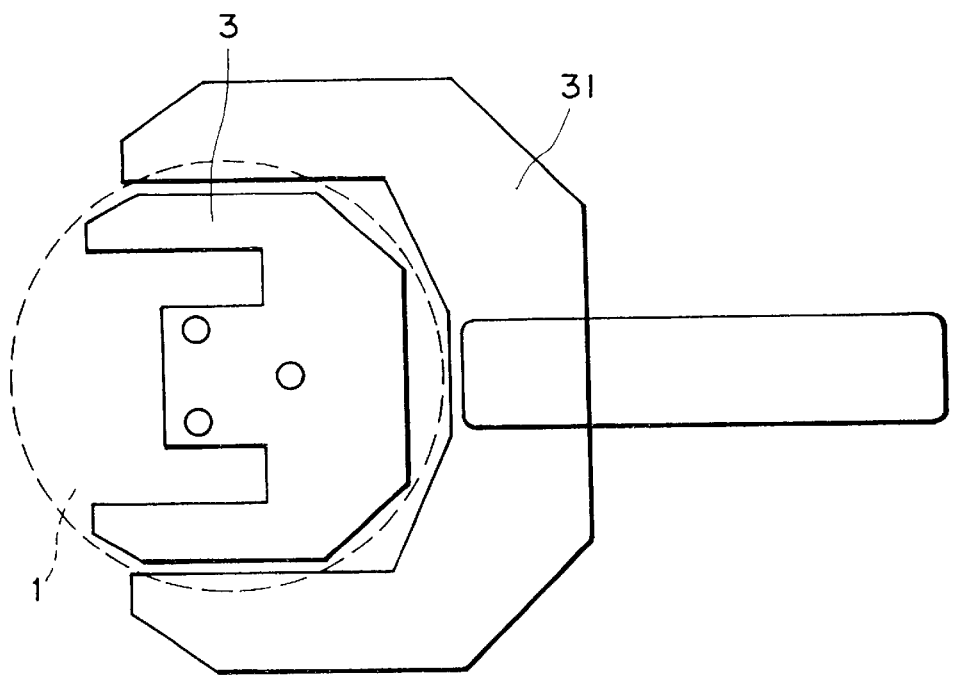
FIG. 3 is a plan view of a substrate conveying system according to an embodiment of the present invention.
Figure 4:
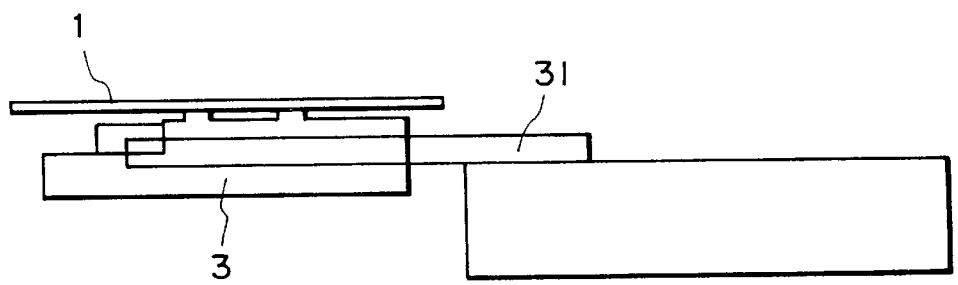
FIG. 4 is a side view of a substrate conveying system according to an embodiment of the present invention.

FIG. 3 is a plan view of a coater/developer hand for transferring a wafer 1 from the outside to the substrate receiving station of the substrate conveying system of this embodiment. As shown in the drawing, the coater/developer hand 31 is arranged so as not to interfere with the temperature adjusting plate 3. FIG. 4 is a side view of the coater/developer hand for transferring the wafer 1 from the outside, to the substrate receiving station of the substrate conveying system of this embodiment.

Figure 5:
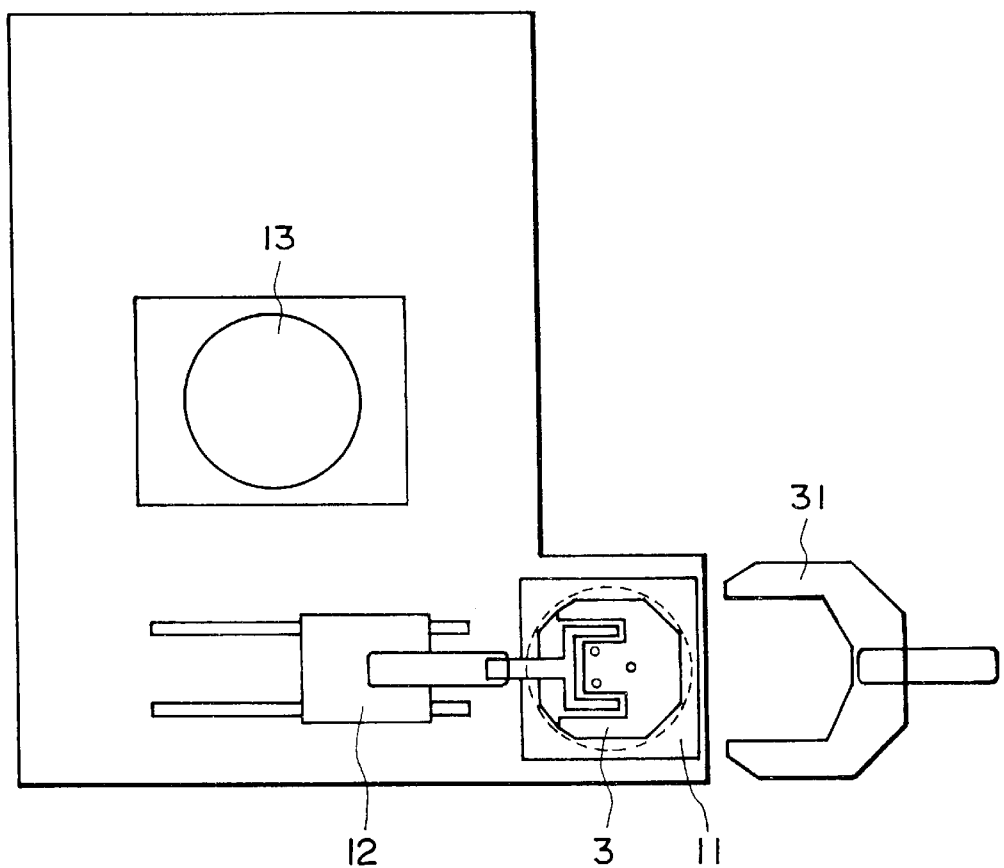
FIG. 5 is a plan view of a general structure of a semiconductor exposure apparatus according to an embodiment of the present invention.

FIG. 5 is a plan view, illustrating a general structure of a semiconductor exposure apparatus 14 according to an embodiment of the present invention. In FIG. 5, there are a substrate receiving station 11, being protruded outwardly of the semiconductor exposure apparatus, and a substrate conveying system 12 for conveying a wafer 1 to an exposure stage 13.

Sequential operations of the substrate conveying system 12 inside the semiconductor exposure apparatus 14 will be described. First, a wafer 1 is transferred onto the substrate receiving station 11, from a coater/developer hand 31, outside the semiconductor exposure apparatus 14. The wafer is left on the substrate receiving station 11 for a while. As the exposure stage 13 asks for a subsequent wafer in response to completion of the exposure process to a current wafer, the substrate conveying system 12 comes to the substrate receiving station to receive the wafer 1. Then, the wafer 1 is conveyed to the exposure stage 13, and the exposure process for the same is initiated.

Temperature adjustment for the wafer 1 upon the substrate receiving station 11 will now be described. The coater/developer hand 31 outside the exposure apparatus 14 loads a wafer 1 on the temperature adjusting plate 3 of the substrate receiving station 11. As the wafer 1 is placed on the temperature adjusting plate 3, the wafer 1 contacts the temperature adjusting plate 3 through its small protrusions 3a, such that the temperature adjustment of the wafer 1 is carried out. The temperature adjusting plate 3 is formed with a notch 3b of a shape corresponding to the fingers 2. As the temperature adjustment of the wafer 1 is completed, the fingers 2 are moved vertically, so that the wafer 1 supported by the temperature adjusting plate 3 is lifted by the fingers 2. Then, the hand arm 5 moves the wafer 1 horizontally, toward the exposure stage 13.

As regards the temperature adjusting method for the wafer 1, the temperature adjusting plate 3 at the substrate receiving station is provided with small protrusions 3a which serve to define a small space or clearance 30 between the temperature adjusting plate 3 and the wafer 1. Through this small clearance 30, heat exchange is carried out between the wafer 1 and the temperature adjusting plate 3. Preferably, the clearance 30 has a size not greater than 0.2 mm. With this structure, the heat exchange can be done with substantially the same effect as in a case wherein two objects are in direct contact with each other. By use of non-contact temperature adjusting means such as described above, as compared with a conventional arrangement wherein the temperature adjusting plate 3 and a wafer 1 are brought into contact with each other, the possibility of contaminants adhering to the bottom face of the wafer can be reduced significantly.

When a wafer 1 is conveyed by use of the substrate conveying system 12 of the structure such as described above, due to a difference in process speed, the temperature adjustment for the wafer 1 can be done within a period in which the wafer 1 is held in a stand-by state at the substrate receiving station 11. Thus, the temperature adjustment of the wafer 1 can be accomplished without a loss in the sequential operations. As a result, the wafer temperature adjustment is attainable without a decrease of the overall processing speed of the semiconductor exposure apparatus.

In accordance with the embodiments as described hereinbefore, the substrate temperature adjustment can be accomplished without a decrease of the processing speed of the semiconductor manufacturing apparatus as a whole. Further, production and adhesion of contaminants can be prevented. Particularly, in a semiconductor exposure apparatus, when a substrate whose temperature is thus controlled is used, a high precision exposure process can be provided.

Next, an embodiment of a semiconductor device manufacturing method which uses a semiconductor exposure apparatus such as described above, will be explained.

Figure 6:
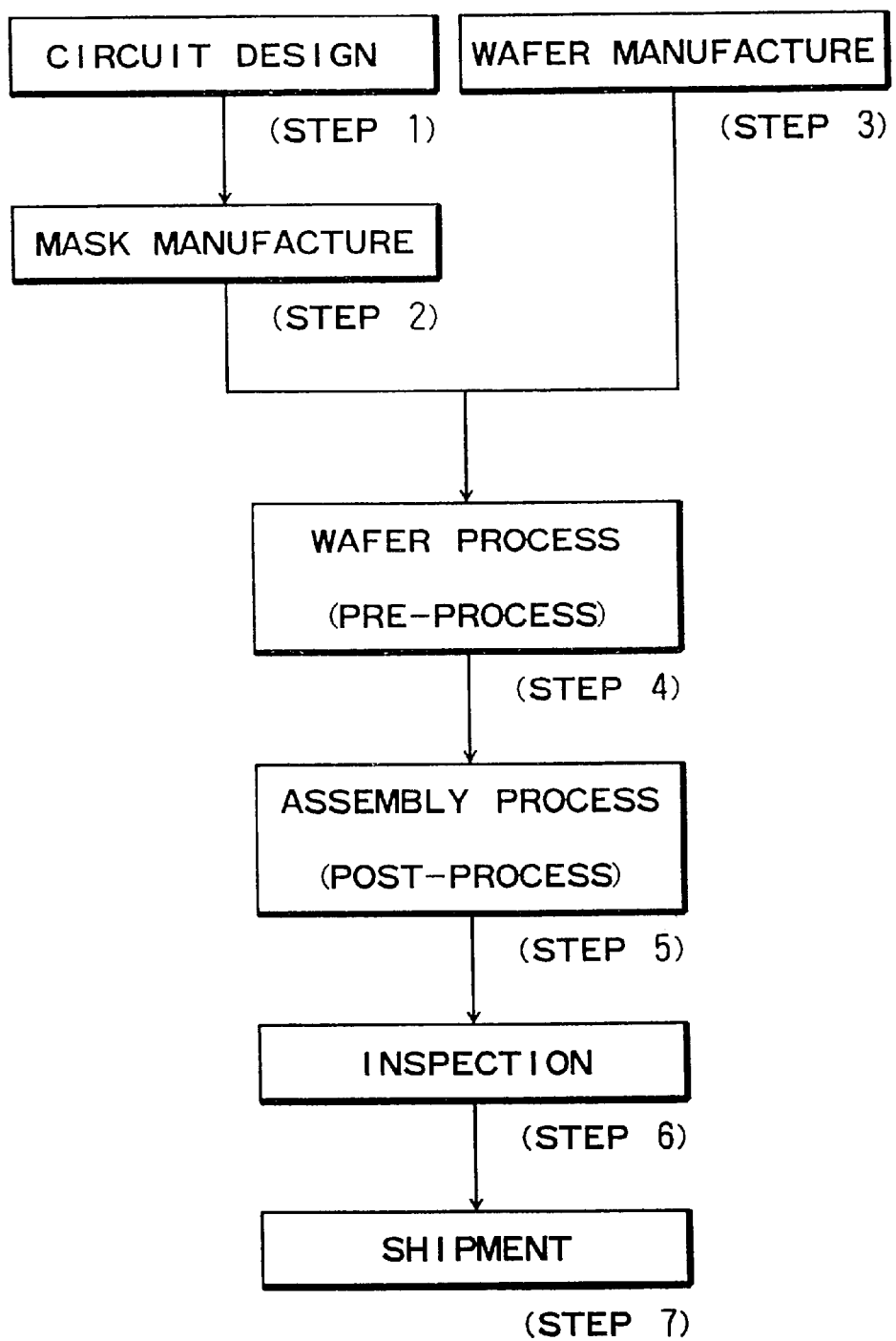
FIG. 6 is a flow chart of semiconductor device manufacturing processes.

FIG. 6 is a flowchart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 7:
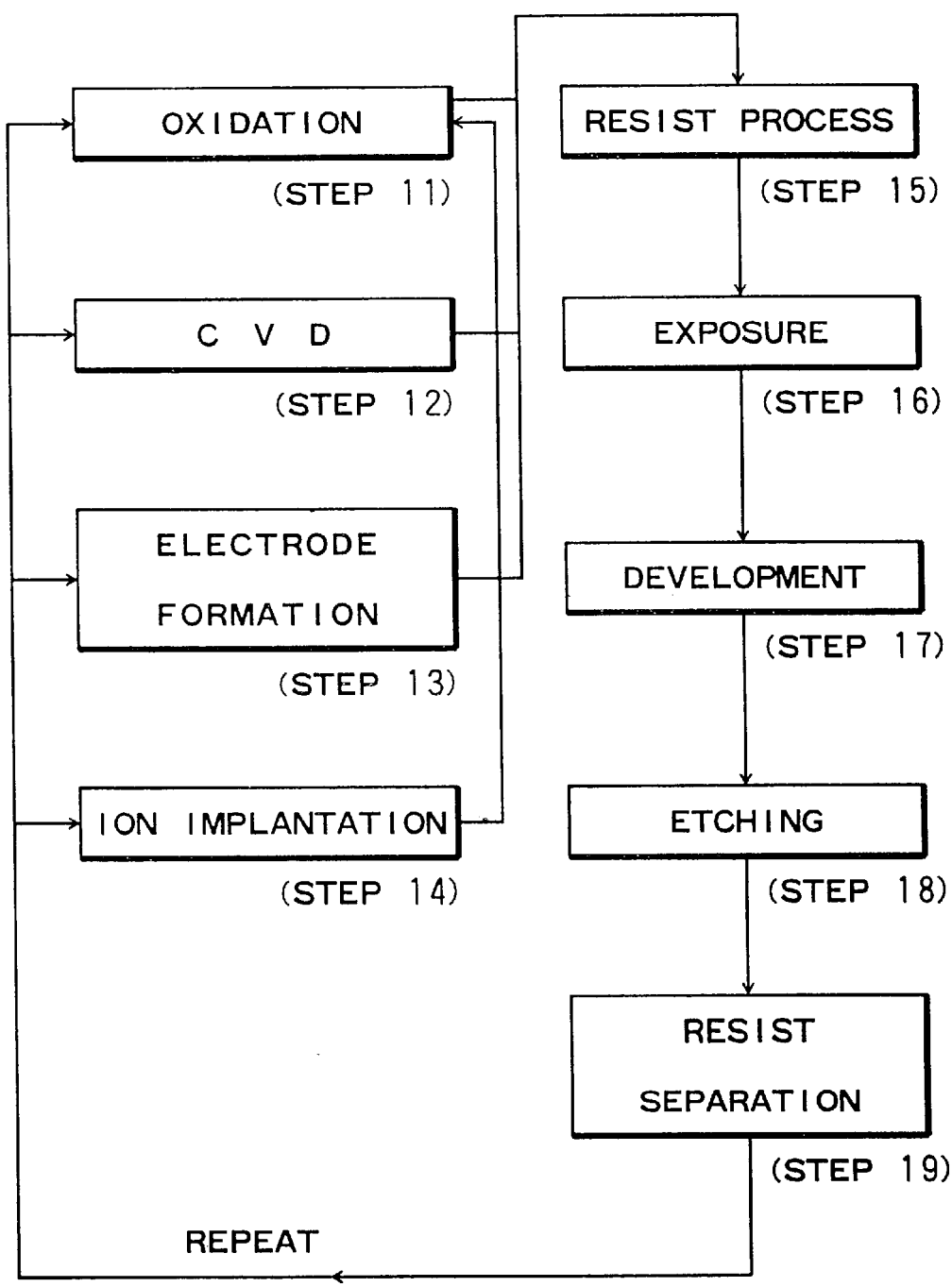
FIG. 7 is a flow chart of a wafer process.

FIG. 7 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor exposure apparatus comprising:

exposure processing means for performing a predetermined exposure process to a substrate;

a transfer station for receiving a substrate from a resist coating unit provided outside said semiconductor exposure apparatus, said transfer station having temperature adjusting means for adjusting temperature of a substrate; and conveying means for conveying a substrate from said transfer station to said exposure processing means, wherein said temperature adjusting means adjusts the temperature of the substrate in accordance with a state of processing at said exposure processing means.

2. An apparatus according to claim 1, wherein said temperature adjusting means adjusts temperature of a substrate when the substrate is placed in a stand-by state with respect to said exposure processing means.

3. An apparatus according to claim 1, wherein said temperature adjusting means adjusts temperature of a first substrate after said transfer station receives the first substrate and before an exposure process to a second substrate, conveyed to said exposure processing means before the first substrate, is completed.

4. An apparatus according to claim 1, wherein said resist coating unit includes second conveying means for conveying a resist-coated substrate to the transfer station inside said semiconductor exposure apparatus.

5. An apparatus according to claim 1, wherein said resist coating unit includes means for developing a substrate having been subjected to an exposure process.

6. An apparatus according to claim 1, wherein said conveying means includes a plurality of substrate conveying robots.

7. An apparatus according to claim 1, wherein said conveying means includes a plurality of substrate conveying robots, and an intermediate transfer table disposed between adjacent substrate conveying robots and for performing transfer of a substrate between them.

8. An apparatus according to claim 1, wherein said temperature adjusting means includes at least these protrusions for holding a substrate.

9. An apparatus according to claim 1, wherein said conveying means includes a conveying hand, and wherein said temperature adjusting means includes a notch defined to avoid interference with said conveying hand of said conveying means.

10. A semiconductor exposure apparatus comprising:

exposure processing means for performing a predetermined exposure process to a substrate;

a transfer station for receiving a substrate from a resist coating unit, said transfer station having a temperature adjusting plate for adjusting temperature of a substrate; and conveying means for conveying a substrate from said transfer station to said exposure processing means, said conveying means having a conveying hand, wherein said temperature adjusting plate has a notch defined to avoid interference with said conveying hand of said conveying means.

11. A semiconductor manufacturing system comprising:

a resist coating unit for coating a substrate with a resist;

an exposure processing unit for performing a predetermined exposure process to a substrate;

a transfer station for receiving a substrate from said resist coating unit, said transfer station having temperature adjusting means for adjusting temperature of a substrate; and conveying means for conveying a substrate from said transfer station to said exposure processing unit, wherein said temperature adjusting means adjusts temperature of a substrate in accordance with a state of processing at said exposure processing unit.

* * * * *